United States Patent
Mieno

(10) Patent No.: US 8,865,552 B2
(45) Date of Patent: Oct. 21, 2014

(54) FIN FIELD EFFECT TRANSISTOR AND FABRICATION METHOD

(71) Applicant: Semiconductor Manufacturing International Corp., Shanghai (CN)

(72) Inventor: Fumitake Mieno, Shanghai (CN)

(73) Assignee: Semiconductor Manufacturing International Corp., Shanghai (CN)

(*) Notice: Subject to any disclaimer, the term of this patent is extended or adjusted under 35 U.S.C. 154(b) by 0 days.

(21) Appl. No.: 13/777,346

(22) Filed: Feb. 26, 2013

(65) Prior Publication Data

US 2013/0228832 A1    Sep. 5, 2013

(30) Foreign Application Priority Data

Mar. 2, 2012   (CN) .......................... 2012 1 0054232

(51) Int. Cl.
    *H01L 21/336*   (2006.01)
    *H01L 29/66*   (2006.01)
    *H01L 29/78*   (2006.01)

(52) U.S. Cl.
    CPC ........ *H01L 29/66795* (2013.01); *H01L 29/785* (2013.01); *H01L 29/7851* (2013.01)
    USPC ....................................................... 438/283

(58) Field of Classification Search
    None
    See application file for complete search history.

(56) References Cited

U.S. PATENT DOCUMENTS

| | | | |
|---|---|---|---|
| 7,868,380 B2 | 1/2011 | Kim et al. | |
| 2002/0090818 A1* | 7/2002 | Thilderkvist et al. | 438/689 |
| 2004/0053515 A1* | 3/2004 | Comita et al. | 438/795 |
| 2006/0197140 A1* | 9/2006 | Muralidhar et al. | 257/315 |
| 2007/0252206 A1* | 11/2007 | Yamazaki et al. | 257/347 |
| 2013/0078818 A1* | 3/2013 | Lin et al. | 438/761 |
| 2013/0302954 A1* | 11/2013 | Lutz | 438/197 |

\* cited by examiner

*Primary Examiner* — Charles Garber
*Assistant Examiner* — Stanetta Isaac
(74) *Attorney, Agent, or Firm* — Anova Law Group, PLLC

(57) ABSTRACT

A fin field effect transistor and a method for forming the fin field effect transistor are provided. In an exemplary method, the Fin FET can be formed by forming a dielectric layer and a fin on a semiconductor substrate. The fin can be formed throughout an entire thickness of the dielectric layer and a top surface of the fin is higher than a top surface of the dielectric layer. The fin can be annealed using a hydrogen-containing gas and a repairing gas containing at least an element corresponding to a material of the fin. A gate structure can be formed on the top surface of the dielectric layer and at least on sidewalls of a length portion of the fin after the annealing process.

18 Claims, 5 Drawing Sheets

FIN FIELD EFFECT TRANSISTOR AND FABRICATION METHOD

CROSS REFERENCE TO RELATED APPLICATIONS

This application claims priority to Chinese patent application No. 201210054232.6, filed on Mar. 2, 2012 and entitled "METHOD FOR FORMING FIN FIELD EFFECT TRANSISTOR", the entire disclosure of which is incorporated herein by reference.

FIELD OF THE DISCLOSURE

The present disclosure generally relates to the field of semiconductor manufacturing technology and, more particularly, to a fin field effect transistor (Fin FET) and a method for forming the Fin FET.

BACKGROUND OF THE DISCLOSURE

With increasing development of semiconductor technology, and with downsizing of process nodes, the gate-last technology has been widely used to achieve desired threshold voltage and to improve device performance. However, when critical dimensions of devices further decrease, even if the gate-last technology is used, conventional MOS field effect transistors (FETs) are not able to meet the requirements on the device performance. Thus, multi-gate devices have been widely used.

Fin field effect transistors (Fin FETs) are multi-gate devices which are widely used nowadays. FIG. 1 is a perspective view of a common type of Fin FET. As shown in FIG. 1, the Fin FET includes a substrate 10 and a fin structure 14 protruding from the substrate 10. A dielectric layer 11 is disposed to cover the substrate 10 on opposite sides of the fin structure 14 and to cover a portion of sidewalls of the fin structure 14. A gate structure 12, including a gate dielectric layer and a gate electrode layer (not shown in FIG. 1), is disposed on the dielectric layer 11. The gate structure 12 stretches over the fin structure 14, partially covering the top surface and sidewalls of the fin structure 14. A source region and a drain region are respectively disposed within the fin structure 14 on both sides of gate structure 12. On the top surface and sidewalls of the fin structure 14, several regions are in contact with the gate structure 12. Therefore, multiple channel regions are formed, which may increase the drive current of the Fin FET and improve the device performance. However, when process nodes shrink further, problems may occur and affect performance of the Fin FET device.

Therefore, there is a need to provide a Fin FET and a method for forming the Fin FET with improved device performance

SUMMARY

According to various embodiments, there is provided a method for forming a Fin FET. The Fin FET can be formed by providing a semiconductor substrate. A dielectric layer and a fin can be formed on the semiconductor substrate. The fin is formed throughout an entire thickness of the dielectric layer and a top surface of the fin is higher than a top surface of the dielectric layer. The fin can be annealed using a hydrogen-containing gas and a repairing gas containing at least an element corresponding to a material of the fin. A gate structure can be formed on the top surface of the dielectric layer and at least on sidewalls of a length portion of the fin after the annealing process.

According to various embodiments, there is also provided a Fin FET. The Fin FET can include a dielectric layer disposed on a semiconductor substrate. A fin can be disposed on the semiconductor substrate and throughout an entire thickness of the dielectric layer. The fin can have a top surface higher than a top surface of the dielectric layer and is an annealed fin annealed using a hydrogen-containing gas and a repairing gas containing at least an element corresponding to a material of the fin. A gate structure can be disposed on the top surface of the dielectric layer and at least on sidewalls of a length portion of the annealed fin.

As disclosed herein, when the annealing process is performed in the presence of hydrogen-containing gas, atoms inside the fin can be recombined and lattice defects can be relieved. Because the repairing gas contains the element for forming the fin, during the annealing process, atoms corresponding to the material of the fin can be formed to fill a recess at the surface of the fin. The surface of the fin becomes sufficiently smooth to facilitate a tight joint between the gate structure and the surface of the fin. The formed Fin FET can thus have low gate leakage current and stable device performance.

Other aspects or embodiments of the present disclosure can be understood by those skilled in the art in light of the description, the claims, and the drawings of the present disclosure.

DETAILED DESCRIPTION OF THE DISCLOSURE

Figure 1:
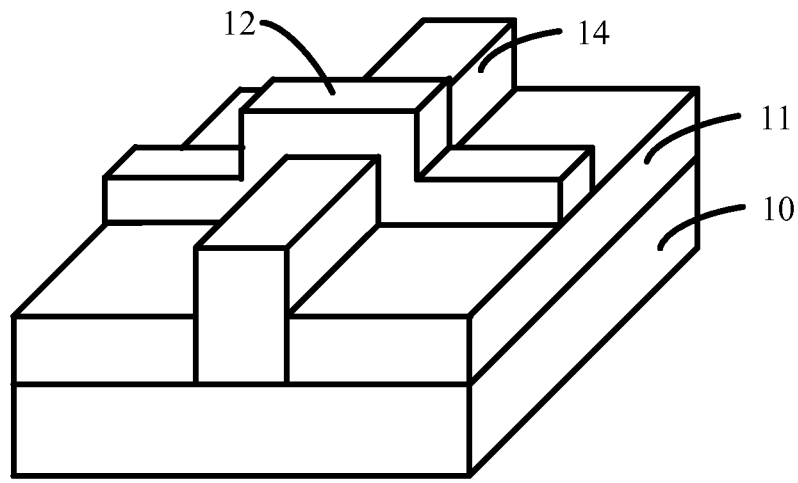
FIG. 1 is a three-dimensional structural view of a conventional fin field effect transistor.

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

Figure 2:
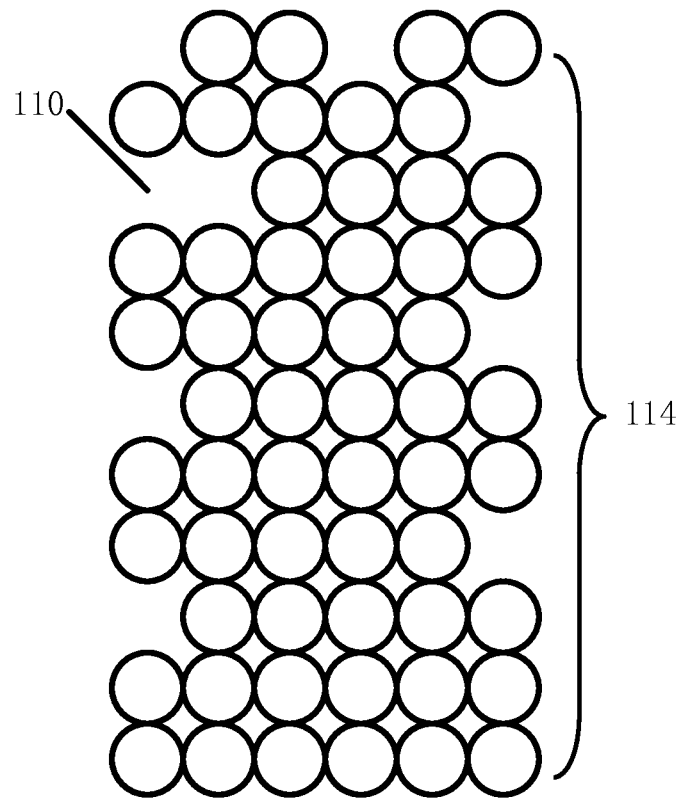
FIGS. 2-4 are microscopic schematic views illustrating a process for forming a fin structure according to various disclosed embodiments.

FIG. 2 is a microscopic schematic view illustrating a process for forming a fin field effect transistor. As shown in FIG. 2, when forming a fin 114, an etching process is often conducted using an etching gas. The etching gas may react with surface of the fin 114. A recess 110 may be formed on the surface of the fin 114, which may adversely affect formation and function of a subsequently-formed gate structure. For example, the gate structure and the surface of the fin 114 may not be tightly joined. Large gate leakage current may be caused when the Fin FET is in operation, and device performance may be unstable.

Figure 3:
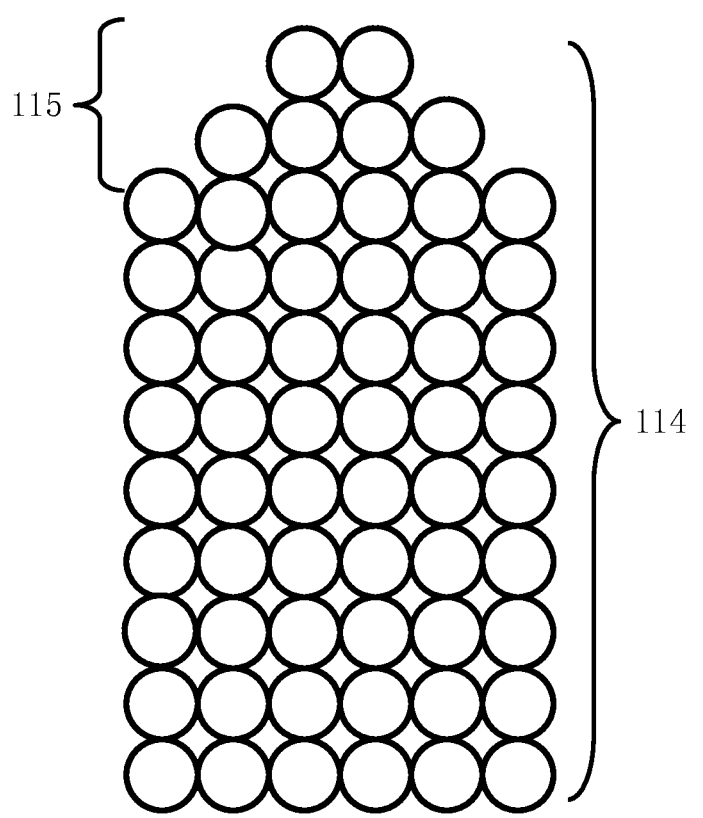

Referring to FIG. 3, when an annealing process is performed to anneal the fin 114 using a hydrogen-containing gas, the atoms inside the fin 114 are recombined. The lattice defects inside the fin 114, such as cavities and dislocations, may be relieved to certain extent, and a portion of the recesses on the surface of the fin 114 may be repaired due to motion and recombination of the atoms of the fin 114. However, the total number of the atoms in the fin 114 may be unchanged. When defects at some locations (e.g., on sidewalls and inside) in the fin 114 are repaired, new defects may be generated at other locations in the fin 114. For example, as shown in FIG. 3, a top 115 of the fin 114 may become a semi-sphere. In some cases, a vertex angle (not shown) of the fin 114 may become rounded. When forming a gate structure on the fin 114, such semi-sphere shaped top and rounded vertex angle may cause problems affecting interaction (e.g., no tight joint) between the gate structure and the surface of the fin 114. Gate leakage current may be generated when the Fin FET is in operation, adversely affecting the device performance.

Figure 4:
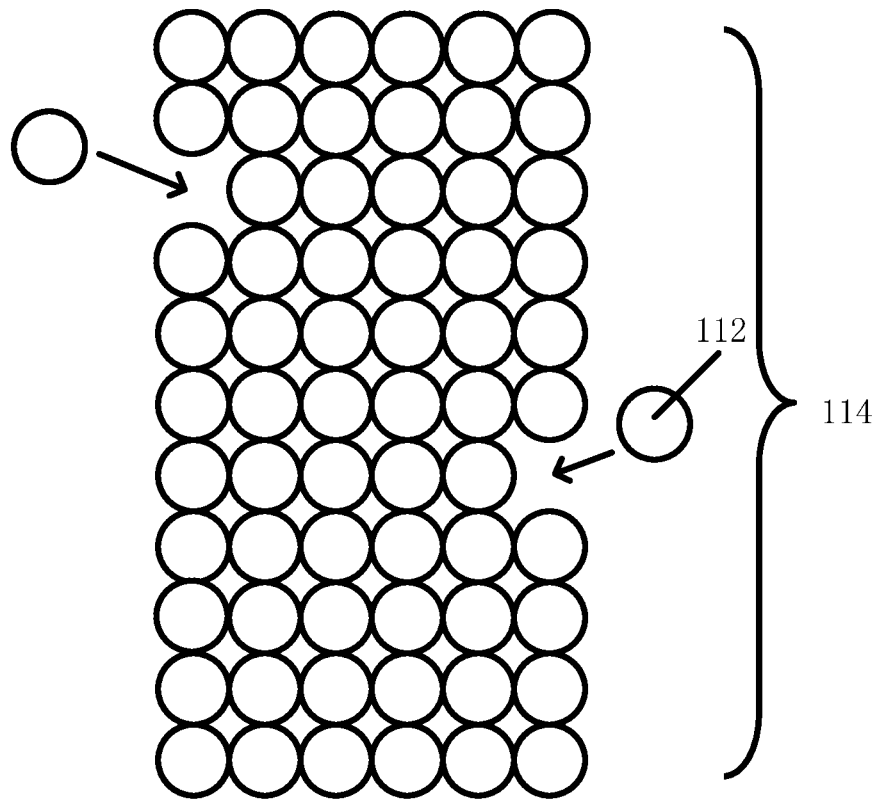

Further, referring to FIG. 4, when the annealing process is performed to anneal the fin 114 using a hydrogen-containing gas atmosphere, a repairing gas corresponding to the material of the fin 114 can be added. The repairing gas contains the element for forming the fin 114. During the annealing process, as shown in FIG. 4, an atom 112 of the repairing gas corresponding to the material of the fin 114 fills the recess (not shown) on the surface of the fin 114, so that the surface of the fin 114 becomes smoother. This can facilitate a tight joint between the subsequently-formed gate structure and the fin 114. Therefore, the formed Fin FET has low gate leakage current and stable device performance.

Figure 5:
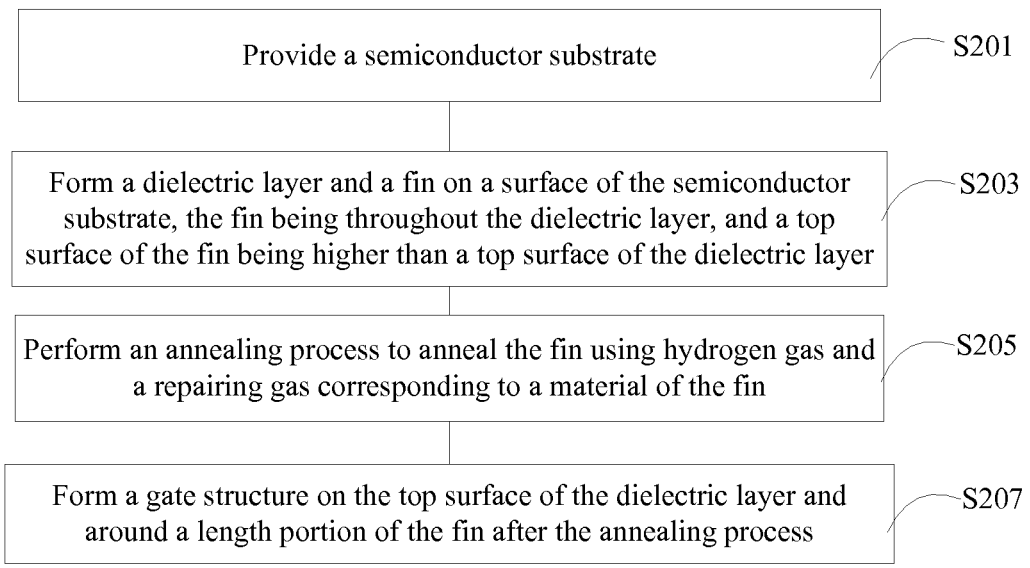
FIG. 5 is a flow chart of an exemplary method for forming a fin field effect transistor according to various disclosed embodiments.
Figure 7:
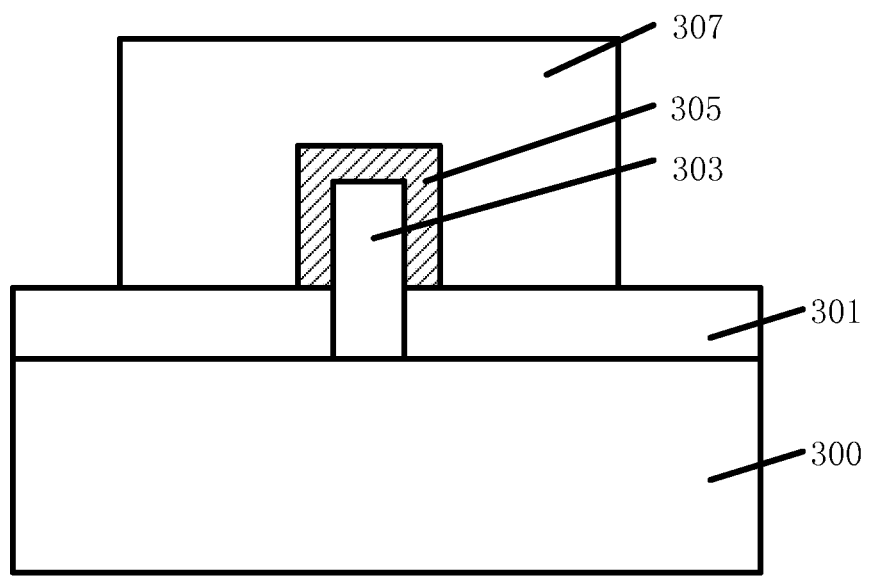
Figure 8:
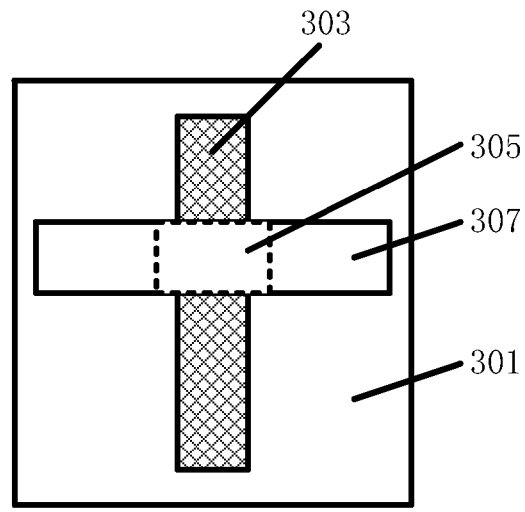
FIG. 8 is a top view of the fin field effect transistor shown in FIG. 7 according to various disclosed embodiments.

FIG. 5 is a flow chart of an exemplary method for forming a fin field effect transistor according to various disclosed embodiments. The formed Fin FET can have improved device performance. For example, the exemplary method depicted in FIG. 5 is described in detail with reference to FIGS. 6-8. Specifically, FIGS. 6-7 are cross-sectional views of intermediate structures illustrating the exemplary method for forming the fin field effect transistor; and FIG. 8 is a top view of the fin field effect transistor shown in FIG. 7 according to various disclosed embodiments.

Figure 6:
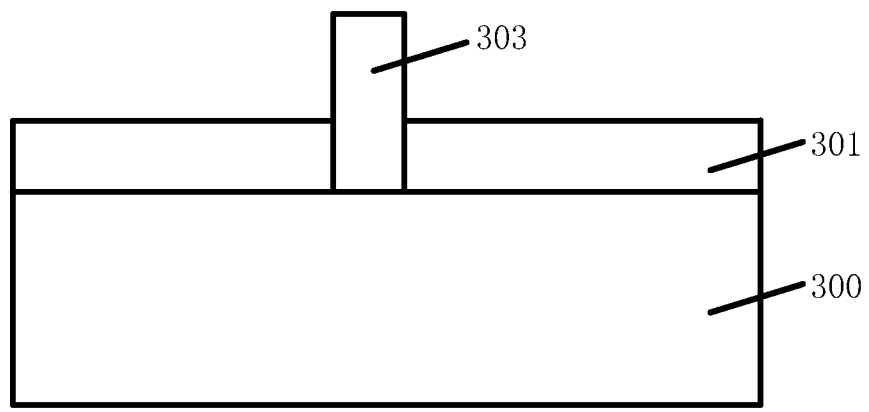
FIGS. 6-7 are cross-sectional views of intermediate structures illustrating a process for forming a fin field effect transistor according to various disclosed embodiments.

In Step S201 of FIG. 5 and referring to FIG. 6, a semiconductor substrate 300 is provided. The semiconductor substrate 300 is used for providing a working platform for the following processes, e.g., which are performed based on the surface of the semiconductor substrate 300 for forming the exemplary Fin FET. The material of the semiconductor substrate 300 is silicon or silicon on insulator (SOI) or any other suitable material. In an embodiment, the semiconductor substrate 300 is an SOI substrate.

In Step S203 of FIG. 5 and referring to FIG. 6, a dielectric layer 301 and a fin 303 are disposed on the surface of the semiconductor substrate 300. The fin 303 is formed through an entire thickness of the dielectric layer 301, and a top surface of the fin 303 is higher than a top surface of the dielectric layer 301. The dielectric layer 301 is used for isolating a subsequently-formed gate electrode layer from the semiconductor substrate 300. In an embodiment, the material of the dielectric layer 301 is $SiO_2$.

The fin 303 serves as an important part of the exemplary Fin FET to be formed. The fin 303 is formed by depositing and etching processes to penetrate through the dielectric layer 301 and have the top surface higher than the top surface of the dielectric layer 301. The material of the fin 303 is SiGe, Ge and/or a III-V group compound (such as GaAs and InP). As an example, the material of the fin 303 is SiGe.

In other embodiments, the fin 303 may penetrate through the dielectric layer 301 and extend into a recessed portion of the semiconductor substrate 300, so as to decrease the gate leakage current of the Fin FET.

In Step S205 of FIG. 5 and referring to FIG. 6, an annealing process is performed to anneal the fin 303, e.g., using hydrogen-containing gas and a repairing gas containing at least an element corresponding to the material for forming the fin 303.

The hydrogen-containing gas is used to move and recombine atoms inside the fin 303, when the annealing process is performed. Lattice defects, such as vacancies and dislocations, generated at certain locations of the fin 303 may be eliminated or repaired. However, because the total number of the atoms of the formed fin 303 is constant, new defects may be generated at other locations inside or on sidewall surfaces of the fin 303. For example, the top of the fin 303 may become a semi-sphere, or the vertex angle of the fin 303 may become rounded. When forming a gate structure on the fin 303, such semi-sphere shaped top and rounded vertex angle may cause problems affecting interaction (e.g., no tight joint) between the gate structure and the surface of the fin 303. Gate leakage current may be generated when the Fin FET is in operation, adversely affecting the device performance.

As disclosed herein, a repairing gas corresponding to the material of the fin 303 may be added in the annealing process. For example, the repairing gas contains an element of the fin 303. During the annealing process, atoms corresponding to the material of the fin 303 are formed from the repairing gas to fill possible recesses on the surface of the fin 303. The surface of the fin 303 becomes smoother to facilitate tight joint between the subsequently-formed gate structure and the fin 303. The formed Fin FET thus has low gate leakage current with stable device performance.

As an example, the repairing gas is a silicon source gas, such as, disilane, trisilane, tetrasilane and/or pentasiliane. During the annealing process, silicon atoms in the gas can be added to the fin 303 such that the sidewalls and the top of the fin 303 are sufficiently smooth, e.g., without forming the top of the fin 303 a semi-sphere, and without rounding the vertex angle. As disclosed herein, the linear growth rate of the silicon atom is within the range from about 2000 cm/s to about 8000 cm/s. Surface of the formed fin 303 is sufficiently smooth and prepared for forming a high quality gate structure having tight joint with the fin 303. Further, low annealing temperatures may be used to form the fin 303 with high quality and to provide the formed Fin FET with stable performance.

The linear growth rate of the silicon atoms may be determined by process parameters in the annealing process. In one embodiment when disilane is used as the silicon source gas, the temperature for the annealing process ranges from about 600° C. to about 950° C., the pressure in the annealing chamber ranges from about 0.01 Torr to about 60 Torr, the time length for annealing ranges from about 1 millisecond to about 60 minutes, and the linear growth rate of the silicon atoms can be up to about 2000 cm/s to about 8000 cm/s.

The amount of silicon source gas added to the annealing process may depend on the silicon atoms needed by the surface of the fin 303. As an example, to produce Fin FET with good performance, the linear growth rate of the silicon atoms at the defects on surface of the fin 303 can be up to about 2000 cm/s to about 5000 cm/s, when the temperature for the annealing process ranges from about 600° C. to about 800° C.; the pressure of the annealing chamber ranges from about 0.01 Torr to about 50 Torr; the time length for annealing ranges from about 1 millisecond to about 60 minutes; and the volume percentage of disilane in a total annealing gas is less than about 0.5%. The annealing gas includes, e.g., the hydrogen-containing gas, the repairing gas, and/or other suitable gas(es).

Further, to avoid the silicon atoms being deposited at locations other than the defects of the fin 303, the amount of silicon in the silicon source gas is accurately controlled. In yet another example, to produce Fin FET with good performance, the line growth rate of the silicon atoms at the defects on surface of the fin 303 can be up to about 3000 cm/s to about 4000 cm/s, when the temperature for the annealing process ranges from about 600° C. to about 750° C.; the pressure of the annealing chamber ranges from about 0.01 Torr to about 40 Torr; the time length of annealing ranges from about 1 millisecond to about 60 minutes; and the volume percentage of disilane in the total annealing gas is less than about 0.5%.

In other embodiments, the repairing gas can be a germanium source gas, or a gas containing an element from III-V group compound. The repairing gas is selected according to the material used for forming the fin.

In Step S207 of FIG. 5 and referring to FIG. 7, after the annealing process, a gate structure is formed on the surface of the dielectric layer 301 and across the top and the sidewalls of the fin 303.

The gate structure includes a gate dielectric layer 305 formed partially around an exposed top portion (i.e., on the top and sidewall surface) of the fin 303. The gate structure also includes a gate electrode layer 307 covering the gate dielectric layer 305. In an embodiment, the material of the gate dielectric layer 305 is silicon oxide or high-K dielectrics or other suitable materials, and the material of the gate electrode layer 307 is metal.

FIG. 8 is a top view of the fin field effect transistor shown in FIG. 7 according to various disclosed embodiments. As shown in FIG. 8, the gate structure stretches across the fin 303. The gate structure formed on the dielectric layer 301 is partially around a length portion of the fin 303. The gate structure is then used as a mask for forming source/drain regions by doping the fin 303 at both sides of the gate structure. Specifically, each of the source/drain regions is formed in a portion of the fin 303 that is partially exposed after the gate structure is formed. The Fin FET is then formed.

In various embodiments, although FIGS. 6-8 depict a tri-gate Fin FET (and its fabrication method) as an example, one of ordinary skill in the art would appreciate that a dual-gate Fin FET (and its fabrication method) can be encompassed herein.

Figure 9:
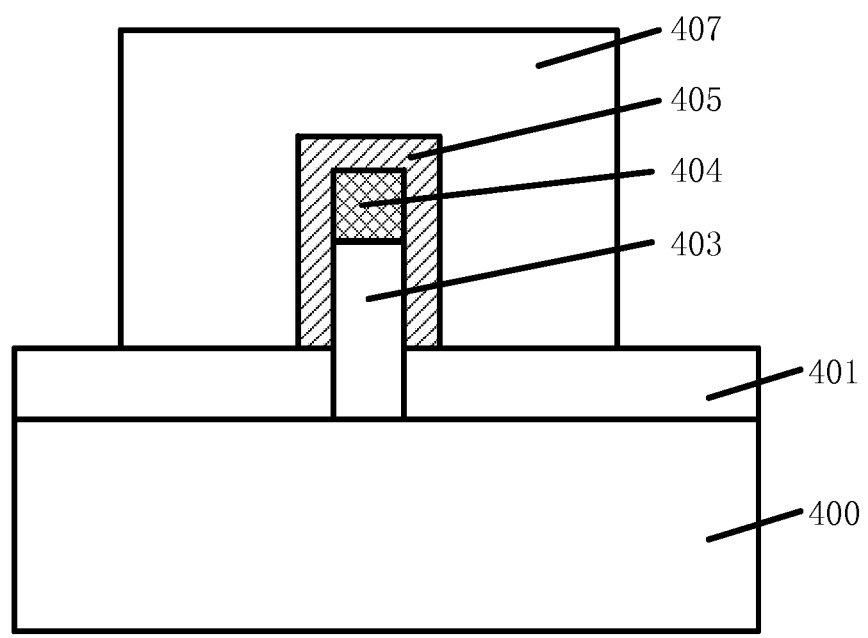
FIG. 9 is a cross-sectional view of another exemplary fin field effect transistor according to various disclosed embodiments.

For example, referring to FIG. 9, a dual-gate Fin FET can be included and formed according to the disclosed methods. An exemplary dual-gate Fin FET is formed as follows.

Firstly, a semiconductor substrate 400 is provided. A dielectric layer 401 is formed on surface of the semiconductor substrate 400. A fin 403 that penetrates through an entire thickness of the dielectric layer 401 is formed on the semiconductor substrate 400. The fin 403 can have a top surface higher than a top surface of the dielectric layer 401.

Secondly, an annealing process is performed to anneal the fin 403 using a hydrogen-containing gas and a repairing gas corresponding to a material used to form the fin 403. Then, an isolation layer 404 is formed to cover the top surface of the fin 403. Further, a gate structure is formed. The gate structure is formed on the top surface of the dielectric layer and cross the top and the sidewalls of the isolation layer 404 and on the sidewalls of the fin 403.

The semiconductor substrate 400 is used as a working platform for forming the dual-gate Fin FET thereon. The material of the semiconductor substrate 400 is silicon or other suitable materials. The dielectric layer 401 is used for isolating the gate electrode layer from the semiconductor substrate 400. The material of the dielectric layer 401 is silicon oxide or other suitable dielectric materials. To reduce short channel effect of the formed dual-gate Fin FET, the material of the fin 403 is SiGe, Ge and/or a III-V group compound (such as GaAs and/or InP).

The repairing gas used in the annealing process is a silicon source gas, a germanium source gas, or a gas containing an element in the III-V group compound. The annealing process can be the same process as described above for forming the tri-gate Fin FET in FIGS. 6-8. The isolation layer 404 is used for isolating the top of the fin 403 from the gate structure. The material of the isolation layer 404 is SiN or other suitable isolation materials.

The gate structure includes a gate dielectric layer 405 formed on surfaces of: sidewalls of the fin 403, and a top and sidewalls of the isolation layer 404. A gate electrode layer 407 is formed covering the gate dielectric layer 405. In one embodiment, the material of the gate dielectric layer 405 is silicon oxide or high-K dielectrics or other suitable dielectrics, and the material of the gate electrode layer 407 is metal.

The dual-gate Fin FET can further be formed by forming source/drain regions, e.g., by doping the fin on both sides of the gate structure using the gate structure as a mask.

In the exemplary dual-gate Fin FET, the top and the sidewalls of the fin 403 are sufficiently smooth to provide tight joint between the isolation layer 404/the gate structure and the fin 403. The formed dual-gate Fin FET has low gate leakage current with stable device performance.

The annealing process is performed to anneal the fin using the hydrogen-containing gas and the repairing gas corresponding to the material of the fin. When the annealing process is performed, under the action of hydrogen-containing gas, atoms inside the fin are recombined and lattice defects inside the fin, such as vacancies and dislocations, are relieved. Because the repairing gas contains element for forming the fin, during the annealing process, atoms corresponding to the material of the fin are formed from the repairing gas and are filled to the recess generated at the surface of the fin. The surface of the fin is thus sufficiently smooth for facilitating tight joint between the gate structure and the fin. As such, the formed dual-gate Fin FET has low gate leakage current with stable device performance.

In various embodiments, the disclosed FETs and fabrication methods may include a fin formed through an entire thickness of the dielectric layer 301/401 (as shown in FIGS. 6-7 and 9) and extended into the semiconductor substrate 300/400 to fill a recessed portion (not shown) in the semiconductor substrate. A gate structure can be formed partially around a length portion of the fin and on the top surface of the dielectric layer. In this case, the fin can include a first sub-fin in the recessed portion of the semiconductor substrate and a second sub-fin through the dielectric layer. A ratio of a height of the second sub-fin (e.g., a height of the dielectric layer) to a height of the first sub-fin is greater than or equal to 5:1. A width of the first sub-fin is less than 3 times a width of the second sub-fin, and is greater than or equal to the width of the second sub-fin. In this manner, possible defects can be trapped in the first sub-fin in the recessed portion of the semiconductor substrate to improve device performance. In various embodiments, the fin is made of a material including one or more of SiGe, Ge, and a III-V group compound, and the semiconductor substrate is made of a material of silicon.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a fin field effect transistor, comprising:
   providing a semiconductor substrate;
   forming a dielectric layer and a fin on the semiconductor substrate, wherein the fin is a protruded fin formed throughout an entire thickness of the dielectric layer, and the protruded fin has a top surface higher than a top surface of the dielectric layer;
   after forming the protruded fin, annealing the protruded fin using a hydrogen-containing gas and a repairing gas containing at least an element corresponding to a material of the fin, such that the top surface and each sidewall of the fin are sufficiently annealed to add the element corresponding to the material of the fin in the repairing gas into both the top surface and each sidewall surface of the fin; and
   forming a gate structure on the top surface of the dielectric layer and at least on sidewalls of a length portion of the fin after the annealing process.

2. The method according to claim 1, wherein the fin is made of a material comprising SiGe, Ge, or a III-V group compound.

3. The method according to claim 1, wherein the repairing gas is a silicon source gas, a germanium source gas, or a gas containing an element from a III-V group compound.

4. The method according to claim 1, wherein the fin is made of SiGe and the repairing gas is a silicon source gas.

5. The method according to claim 4, wherein silicon atom has a linear growth rate ranging from about 2000 cm/s to about 8000 cm/s on a surface of the fin.

6. The method according to claim 5, wherein the annealing is performed at a temperature ranging from about 600° C. to about 950° C. and a pressure in an annealing chamber ranging from about 0.01 Torr to about 60 Torr for a time length ranging from about 1 millisecond to about 60 minutes.

7. The method according to claim 4, wherein the silicon source gas is less than about 0.5% by volume of a total annealing gas.

8. The method according to claim 7, wherein silicon atom has a linear growth rate of about 2000 cm/s to about 5000 cm/s on a surface of the fin.

9. The method according to claim 8, wherein the annealing is performed at a temperature ranging from about 600° C. to about 800° C. and a pressure in an annealing chamber ranging from about 0.01 Torr to about 50 Torr for a time length ranging from about 1 millisecond to about 60 minutes.

10. The method according to claim 4, wherein the silicon source gas is less than about 0.2% by volume of a total annealing gas.

11. The method according to claim 10, wherein silicon atom has a linear growth rate of about 3000 cm/s to about 4000 cm/s on a surface of the fin.

12. The method according to claim 11, wherein the annealing is performed at a temperature ranging from about 600° C. to about 750° C. and a pressure in an annealing chamber ranging from about 0.01 Torr to about 40 Torr for a time length ranging from about 1 millisecond to about 60 minutes.

13. The method according to claim 4, wherein the silicon source gas is disilane, trisilane, tetrasilane, or pentasiliane.

14. The method according to claim 1, wherein the semiconductor substrate is silicon.

15. The method according to claim 1, wherein the gate structure comprises:
   a gate dielectric layer on the top surface of the dielectric layer and at least on the sidewalls of the length portion of the fin; and
   a gate electrode layer on the gate dielectric layer.

16. The method according to claim 1, further comprising using the gate structure as a mask to form a source region and a drain region by doping the fin on both sides of the gate structure.

17. The method according to claim 1, wherein the fin further extends into the semiconductor substrate.

18. A method for forming a fin field effect transistor, comprising:
   providing a semiconductor substrate:
   forming a dielectric layer and a fin on the semiconductor substrate, wherein the fin is a protruded fin formed throughout an entire thickness of the dielectric layer, and the protruded fin has a too surface higher than a too surface of the dielectric layer;
   after forming the protruded fin, annealing the protruded fin using a hydrogen-containing gas and a repairing gas containing at least an element corresponding to a material of the fin such that the too surface and each sidewall of the fin are sufficiently annealed to add the element corresponding to the material of the fin in the repairing gas into both the top surface and each sidewall surface of the fin;
   forming an isolation layer to cover the top surface of the fin, after the annealing process and before forming a gate structure; and
   forming the gate structure on the too surface of the dielectric layer and at least on sidewalls of a length portion of the fin.

* * * * *